United States Patent [19]
Beckwith

[11] Patent Number: 5,774,366
[45] Date of Patent: Jun. 30, 1998

[54] METHOD FOR OBTAINING THE FUNDAMENTAL AND ODD HARMONIC COMPONENTS OF AC SIGNALS

[76] Inventor: Robert W. Beckwith, 2794 Camden Rd., Clearwater, Fla. 34619

[21] Appl. No.: 767,287

[22] Filed: Dec. 16, 1996

Related U.S. Application Data

[63] Continuation-in-part of Ser. No. 493,423, Jun. 22, 1995, abandoned.

[51] Int. Cl.[6] .................................................. G01R 19/00
[52] U.S. Cl. .......................... 364/487; 364/483; 364/576; 324/77 R; 324/74; 324/78 R; 361/35
[58] Field of Search .................................... 364/483, 484, 364/487, 485, 576; 324/77 R, 74, 78 D, 76.24, 76.29, 76.47, 76.55, 76.58; 361/35, 36

[56] References Cited

U.S. PATENT DOCUMENTS

| 5,315,527 | 5/1994 | Beckwith | 364/483 |
| 5,544,064 | 8/1996 | Beckwith | 364/483 |
| 5,646,512 | 7/1997 | Beckwith | 323/257 |

*Primary Examiner*—Emanuel T. Voeltz
*Assistant Examiner*—Kamini S. Shah
*Attorney, Agent, or Firm*—Leo J. Aubel

[57] ABSTRACT

A process for sampling half cycles of AC waves and using precomputed stacks of sine values for obtaining fundamental components and odd harmonic phasers of said AC waves.

18 Claims, 4 Drawing Sheets

METHOD FOR OBTAINING THE FUNDAMENTAL AND ODD HARMONIC COMPONENTS OF AC SIGNALS

This is a continuation in part of U.S. patent application Ser. No. 493,423 filed Jun. 22, 1995, now abandoned.

BACKGROUND OF INVENTION

Many electric utility loads take non-sinusoidal currents. These in turn cause voltage distortion which may adversely effect all loads, including those causing the distortion. It is desirable to measure the distortion of voltages since the voltage is the common mode of coupling harmonic problems from one electric load to another. It is also desirable to measure the distortion of the currents taken by devices which may be the cause of a harmonic problem.

The distribution of power frequency harmonics within an electric power distribution network is dependent on the inductances of the distribution lines, of various power transformers and of consumer owned motors and other inductive loads. Distribution of harmonics is also effected by various capacitive reactance, primarily those used to correct the power factor along distribution lines. The distribution of harmonics varies as power factor capacitors are switched on and off.

It is desirable to measure these voltage distortions at many places on the electric utility system often using devices already required for other purposes. Economical sources for such measurements may be a) controls, especially load tapchanging transformer controls and distribution power factor capacitor switching controls, and b) protective relays already sensing voltages and currents wherein harmonic measurements may be obtained as a by-product of the primary purpose of such devices.

This patent is related to:

1) U.S. Pat. No. 5,315,527 issued to Robert W. Beckwith, the inventor herein. This patent discloses a circuit and a processing and calculation method that makes use of digital samples of one selected polarity of an alternating current (AC) voltage or current signal, taking advantage of the fact that such signals can be expected to have no significant even harmonics. The samples are taken using a monopolar analog to digital converter (ADC) in such a way that it becomes an almost perfect rectifier. Methods are described to obtain phase angles between voltage and current signals. Samples of AC signals are multiplied by themselves, summed and the square root of the sums taken thereby giving rms values of the signals. Use is made of the time during half cycles where the samples are zero to make calculations and perform control actions. Advantages of the use of a high grade capacitive burdens on current transformers producing current signals are given. Advantages for using a high number of samples per half cycle of AC signals are given.

2) U.S. Pat. No. 5,544,064 issued to Robert W. Beckwith the inventor herein. This patent discloses use of microprocessor programs, using no interrupts, operating synchronously with an ADC set in a free running mode when taking positive samples of an AC signal in order to shorten the programs. This makes the programs high speed in operation and permits use of lower frequency microprocessors. Use of sums of samples and alternatively sums of squares of samples are given in combination with use of synchronous programs. The invention further discloses the sending of data in bursts during negative AC half cycles to an external computer. Use of the techniques is illustrated for a load tapchanging transformer LTC control and for two protective relay devices. The external computer performs computations not required in the devices and serves as the man/machine interface for the devices.

3) U.S. patent application Ser. No. 08/698,315 applied for on Aug. 15, 1996 by Robert W. Beckwith the inventor herein describes a device for the combined functions of LTC transformer control and substation power factor capacitor switching control. In addition to invention related to the control functions, use of a computer with an infrared (IR) port is disclosed using an IR port on the device for communications as otherwise described in patent reference 2) cited above. Also described is the multiplying of digital samples of selected half cycles of AC voltage waves with precomputed values of the sine function recorded in permanent memory of control devices and summing the products of the multiplication as a measure of the amplitude of the fundamental component of the AC voltages. Further described is the recording of data in the control device, transfer of data to an external computer via the IR port and display of voltage profile data for the past 24 hours along with a newly defined voltage regulation quality factor (VRQF) for the past 24 hours. Application Ser. No. 698,315 further discloses measurement of P and Q components of a power phaser at the AC power frequency using the AC voltage as a phase reference.

U.S. Pat. No. 5,315,527, U.S. Pat. No. 5,544,064 and application Ser. No. 08/698,315 are incorporated herein by reference.

SUMMARY OF THE INVENTION

Apparatus and methods are given for correlation measurement of half cycles of alternating current (AC) signals to obtain fundamental components of the AC signals and phasers of selected odd harmonics of the AC signals using the AC voltage signal as reference for the harmonic phasers. These harmonic phasers are not to be confused with more commonly used phasers relating AC signals at the fundamental AC frequency. Further correlation is disclosed using AC signal samples taken in a half cycle of the signal with precomputed stacks of values of sine functions of each order of harmonic selected for a time duration equal to one half of the expected period of the AC signals to obtain components of a phaser for the harmonic using zero crossings of the AC signal as a phase reference.

The foregoing features and advantages of the present invention will be apparent from the following more particular description. The accompanying drawings, listed hereinbelow, are useful in explaining the invention.

DESCRIPTION OF THE INVENTION

Figure 1:
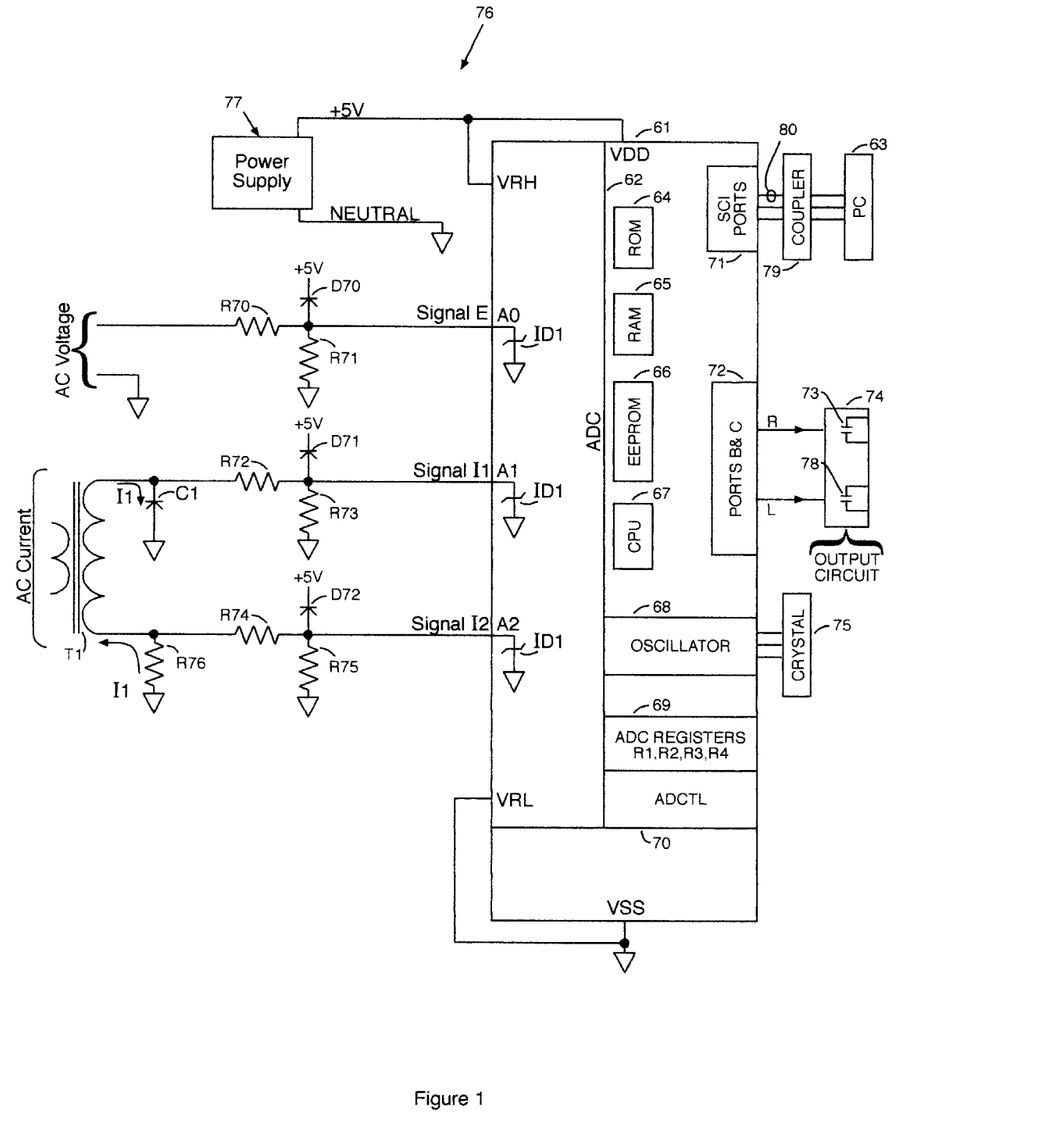
FIG. 1 depicts a typical incorporation of the invention into the control of an LTC transformer.

FIG. 1 illustrates an application of the invention to control 76 for LTC transformers where it is desirable to measure the fundamental components of AC voltage and current inputs for use in determining raise (R) and lower (L) outputs of control 76.

While measurement of harmonics is not generally required by control 76, it is useful for external purposes to determine harmonics by the inventive methods upon demand.

In greater detail, an AC voltage is reduced in amplitude by resistors R70 and R71 forming signal E in turn connected to ADC 62 input A0 of microprocessor 61, said input saturating at a voltage of approximately 5 volts applied to VRH from power supply 77. Power supply 77 powers microprocessor 61 by connection to input VDD. ADC 62 input A0 is protected from positive overvoltages up to the rating of zener diode ID1 of approximately 6 volts and to negative voltages of about 0.7 volts. Diode D70, connected from signal E to +5 volts, protects ADC 62 input A0 from high frequency transient voltages.

AC current I1 flows into capacitor C1 burden to neutral from input current transformer T1. The voltage across C1 is divided by resistors R72 and R73 forming signal I1 in turn connected to ADC 62 input A1. Zener diode ID2 and diode D71 form protection to ADC 62 input A1 as described for zener ID1 and diode D70 respectively.

AC current I1 flows back to transformer T1 through resistor burden R76 from neutral. The voltage across R76 is divided by resistors R74 and R75 forming signal I2 in turn connected to ADC 62 input A2. Zener diode ID3 and diode D72 form protection to ADC 62 input A2 as described for zener ID1 and diode D70 respectively.

Use of capacitor burden C1 reduces the harmonic content of signals I1 and I2 as is desirable for a control 76 which responds to the fundamental component of voltage and current signals. Use of resistive burden R76 is desirable, however, for the ADC 62 input used for measurement of harmonics of current signals. Separate ADC 62 inputs are therefore provided, one with capacitive burden C1 for control 76 and the other with resistive burden R76 for measurement of current harmonics.

Microprocessor 61 contains ADC 62 with transfer of data from ADC 62 to ADC registers 69 by under control by programs held in ROM memory 64. ROM memory 64 also contains precomputed stacks of values described hereinbelow as well as programs for carrying out computations and control as also described hereinbelow. RAM memory 65 is volatile memory used for ongoing computations and control by the operating program contained in ROM 64 using central processing unit CPU 67. EEPROM memory 66 is used to store data which must be held during power interruptions. Oscillator 68 controlled by crystal 75 furnishes operating clock signals as required by microprocessor 61.

While memories 64, 65, and 66 may be on board microprocessor 61 then may alternatively be external devices controlled by microprocessor 61.

The following are connected to a common neutral circuit as shown by downward pointing open triangles: power supply 77, AC voltage input, burden capacitor C1, dividing resistors R71, R73, R75 and R76, microprocessor connections VRL and VSS and protective zener diodes ID1, ID2 and ID3.

Ports B and C 72 control output circuits 74. Said circuit 74 contains selected combinations of conventional transistor and electromechanical relays so as to operate raise switch 73 by way of binary output signals on connection R and lower switch 78 by way of binary output signals on connection L.

Serial communications interface (SCI) ports 71 are supplied asynchronously by microprocessor 61. Coupler 79 is connected to SCI 71 by connections 80. Coupler 79 communicates to external computer PC 63 by a selected combination of the following methods as described in greater detail in reference patent 3) described hereinabove.

a) Two way infra red communications.

b) Wired modems for communications via telephone lines.

c) Wireless modems for communications via selected wireless services.

In the following discussions the word "sample(s)" refers to binary number(s) obtained from ADC's and the word "value(s)" refers to binary number(s) obtained from stacks of precomputed values held in memories as more fully described hereinunder.

Figure 2:
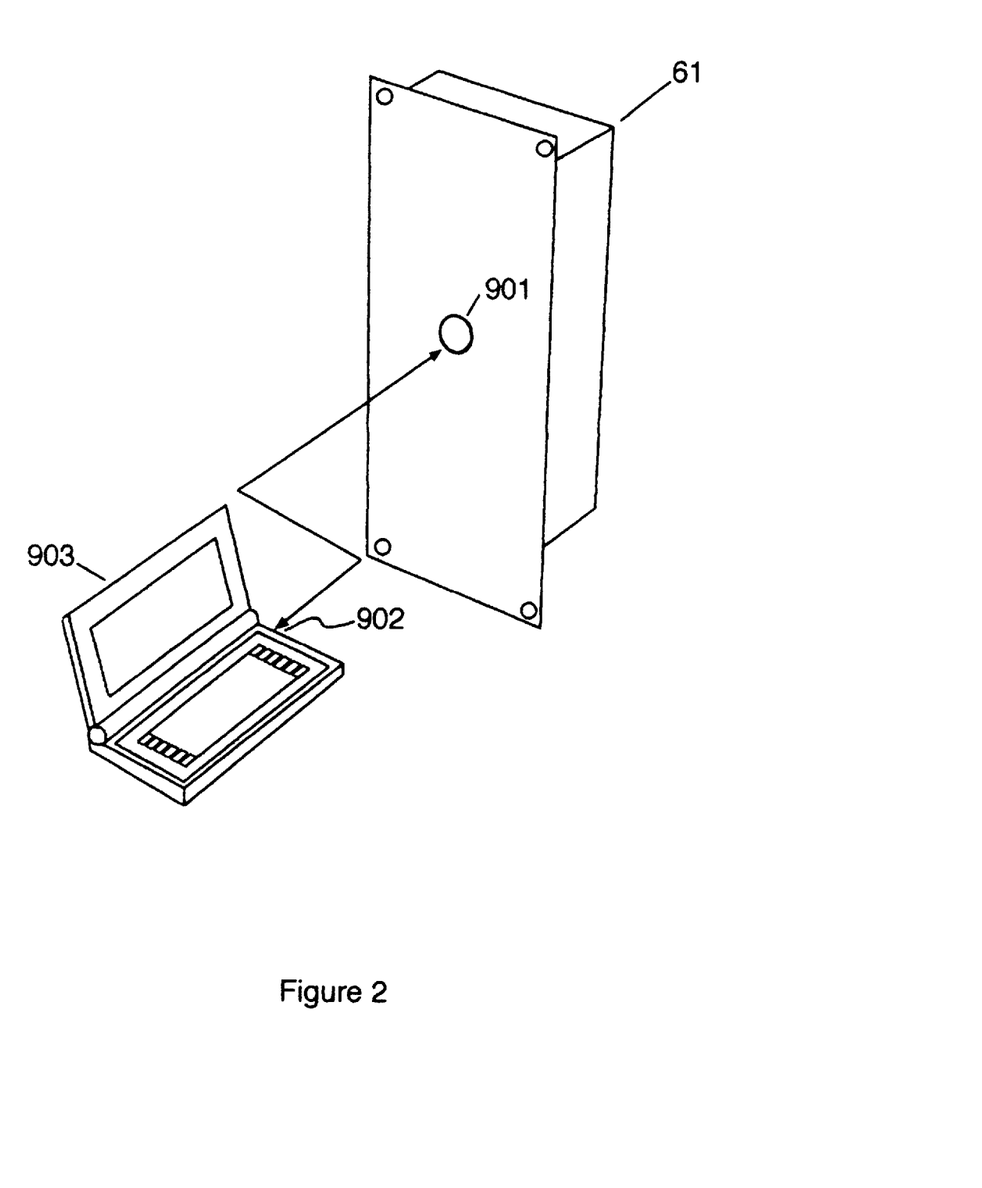
FIG. 2 depicts a preferred application of the invention to a control communicating to a computer via an infra-red port.

FIG. 2 illustrates control 76 having a two way communications from port 901 to port 902 on device 903 using selected combinations of methods a) b) and c) above. Device 903 may typically be hand held computers, lap top computers or personal computers, all being general purpose in nature. Device 903 shown on FIG. 2 corresponds to device PC 63 shown on FIG. 1.

The inventive process for determining the components of AC signal waves is derived as follows:

$$p=(f(a \times b))/((f(a+b)^2)^{1/2}) \qquad (1)$$

where p is the coefficient of correlation having the range of $-1 \rightarrow 0 \rightarrow +1$, and a and b are two functions being correlated and where p=1 indicates that a=b; p=-1 indicates a is the mirror image of b and other magnitudes of p indicate the degree of likeness of a and b.

Equation (1) is the well known equation for cross correlation, from which the following equation (2) can be derived by using the numerator, only, of equation (1). The denominator of equation (1) acts as a scaling factor and herein is combined with other scaling factors, such as values of signal dividing resistors and their tolerance. A combined scaling factor, S, is therefore used and determining by inserting accurate levels of voltages and currents during a calibrating procedure.

$$ph=(S \times f(a \times \sin n\Theta))+j(S \times f(a \times \cos n\Theta)) \qquad (2)$$

Equation (2) is analog in nature and is useful for determining real and imaginary components of a phaser, ph, representing components of an AC signal, a. The integral f is generally computed over 360° of the angle $\Theta$ or an integral multiple thereof. In this invention, however, one half cycle of an AC signal is sampled and represented by a series of such samples of sufficient number, N, to represent an AC signal having no even harmonics but containing the fundamental plus odd harmonic components with a limit of harmonic order H. Typically 246 cycles per half cycles are used with the well known aliasing effect limiting H to N−1 or 245th order of odd harmonic. This is generally well above any harmonic of an AC signal found in practice, in which case the aliasing problem can be ignored. For illustrative purposes, use of 246 samples per half cycle will be assumed hereinunder unless otherwise stated.

In a preferred embodiment of this invention using a microprocessor such as a Motorola HC11E9 and the synchronous programming methods of reference patent 2) described hereinabove, 246 samples are taken of one half cycle of an AC signal at 60 Hz. It is found that this number of samples of a typical voltage signal will remain fixed from less than 90 vac to over 140 vac. A sum is therefore formed by multiplying corresponding pairs of AC signal samples and values from precomputed and stored tables of 123 values as described below, producing as sum of 246 products corresponding to 180° of the fundamental AC signal. The sum is used as representative of components of an AC signal and scaled using constant S experimentally obtained during a test procedure, to a desired standard, such as 120 Vac, as one per unit volts.

Also it should be understood that while we discuss use of the positive half cycle of an AC wave herein, the same concepts and methods can be used utilizing only the negative half cycle.

When an AC signal, a, is represented by such a series of digital samples, equation (2) becomes:

$$ph = S \times \Sigma_1^m (a \times \sin n\Theta) + jS \times \Sigma_1^m (a \times \cos n\Theta) \quad \text{Equation (3)}$$

where sin nΘ and cos nΘ are represented by stacks of values selected to correspond with the expected sampling of signal, a, and where m is the number of samples taken during a half cycle
n is the order of the component of the wave.

Above reference patent 1) discloses the digitization of portions of an AC signal of selected polarity for use where all of the information necessary to make desired measurements of the entire signal is contained in the positive portion of the signal. Reference patent 1) further discloses inventive processes for obtaining and using a high sampling rate in measuring the amplitude of an AC signal. Reference patents 1) and 2) taken together, disclose means and methods for taking a large number of samples during the positive half cycles of AC signals with the negative half cycles suppressed to zero.

Figure 3:
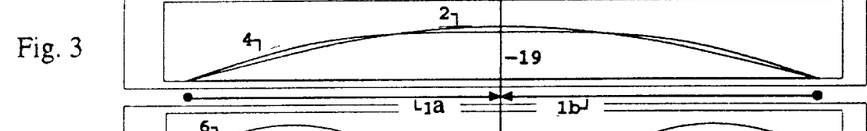
FIG. 3 shows the envelope of digital samples of a positive half cycle of an AC signal with a superimposed distorted wave.

FIG. 3 shows a pure half sine wave 2 with a superimposed distorted wave of an AC signal 4.

MEASUREMENT OF AC SIGNAL FUNDAMENTAL

Figure 9A:
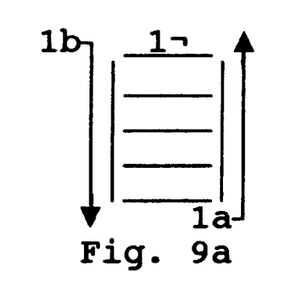
FIGS. 9(a)–9(f) depict various stacks labeled 1b-1a, 3b-3a, 5b-5a, 7b-7a, 9b-9a, and 11b-11a containing precomputed sine values corresponding respectively to the 1st, 3rd, 5th, 7th, 9th and 11th harmonics.
Figure 9B:
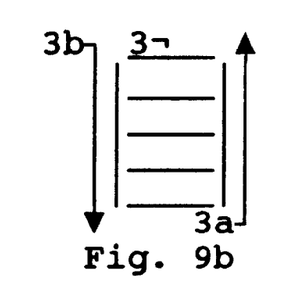
Figure 9C:
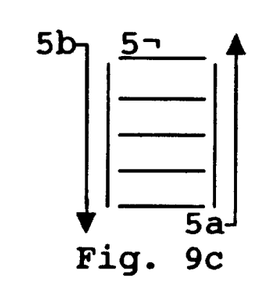
Figure 9D:
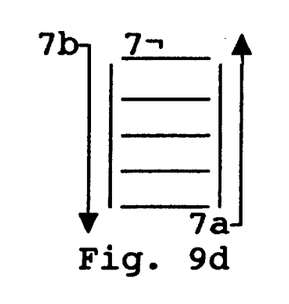
Figure 9E:
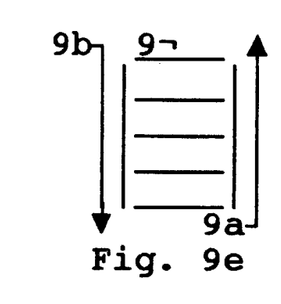
Figure 9F:
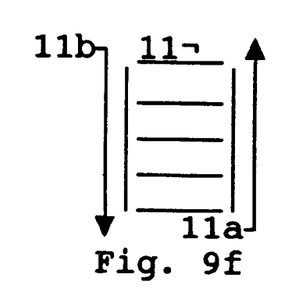

Referring to FIG. 3 and table 1 of FIG. 9, the inventive measurement of the fundamental component of AC signals is as follows:

To obtain the real part of the phaser ph for the fundamental component 2 of an AC signal 4, the sum of equation (3) is formed by multiplying each sample taken during a positive half cycle of an AC signal 4 first with successive ones of 123 stored values of 90° of sine starting from the bottom and proceeding to the top of stack 1 as indicated by arrow 1a. Next the sum of products is completed using successive values from the top and proceeding to the bottom of stack 1 as indicated by arrow 1b. (see arrows 1a and 1b both in FIG. 3 and in FIG. 9, stack 1).

To obtain the reactive or 'jy' part of the phaser ph for the fundamental component 2 of an AC signal 4, the sum of equation (3) is formed by multiplying each sample taken during a positive half cycle of an AC signal 4 first with successive ones of 123 stored values representing 90° of sine starting from the top and progressing to the bottom of stack 1 as indicated by arrow 1b. Next the sum of products is completed using successive values starting from the bottom and progressing to the top of stack 1 as indicated by arrow 1a. (see arrows 1a and 1b both in FIG. 3 and in stack 1 of FIG. 9). For amounts of distortion less than about 10%, however, the inventive process results in only a slight error in measurement of the magnitude of the fundamental component 2 by using only the real term and ignoring the jy term. The inventive process uses the first non-zero sample of the positive half cycle of AC signal 4 (FIG. 3) as the common phaser zero time reference for the fundamental and all odd harmonic components of the AC signal 4.

MEASUREMENT OF HARMONICS

In the inventive method, equation (3) is implemented by multiplying successive non-zero samples of AC signal 4 by successive values from stacks depicted in FIG. 9 numbered to correspond with 1 for the fundamental component and 3 through 11 corresponding to the harmonics illustrated. The real component of the third harmonic is obtained by multiplying samples of signal 4 with successive values of stack 3 starting first from the bottom and progressing to the top and then continuing from the top and progressing to the bottom of the stack 3 as indicated by arrows 3a and 3b shown both on FIGS. 4a and 4b as well as on stack 3 of FIG. 9. The process can be thought as of 'folding' the full number of required values for a half sine wave into a stack of values of one half the full number of values. Stack 3 thus contains m/2 values of 90 degrees of a sine wave, where m is the number of values in one half cycle of an expected AC signal. For example, the number of values expected for a 60 Hz AC signal is equal to 0.008333 seconds divided by the time in seconds between values.

The inventive process takes advantage of the fact that in sampling a half wave of an AC signal, the values of the table for the first (n×90°) are chosen to be equal to the values for the second (n×90°) but in the reverse order; where n=1 for the fundamental component and n=3, 5, 7, 9 and 11 for the odd harmonic components of the half wave illustrated herein.

Figure 4A:
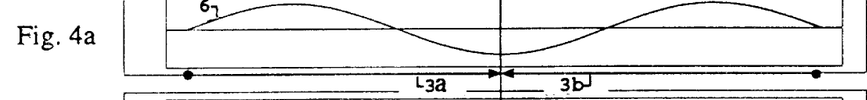
FIGS. 4a and 4b respectively show the envelopes of digital samples for obtaining real and imaginary components of the third harmonic phasers.
Figure 4B:
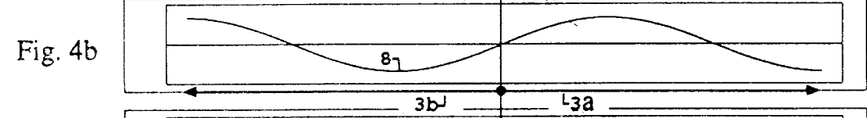
Figure 5A:
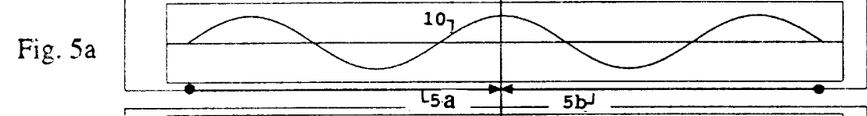
FIGS. 5a and 5b respectively show the envelopes of digital samples for obtaining real and imaginary components of the fifth harmonic phasers.
Figure 5B:
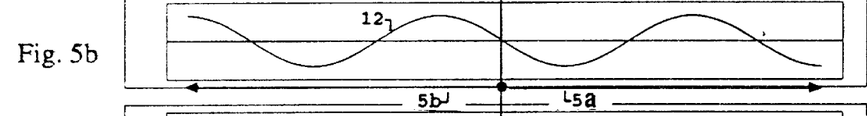
Figure 6A:
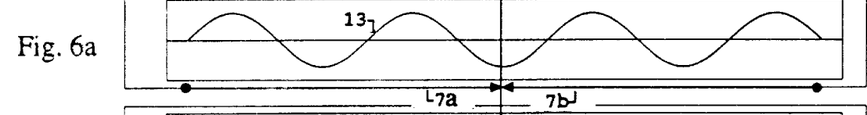
FIGS. 6a and 6b respectively show the envelopes of digital samples for obtaining real and imaginary components of the seventh harmonic phasers.
Figure 6B:
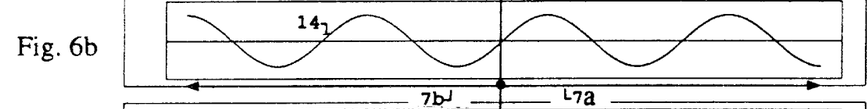
Figure 7A:
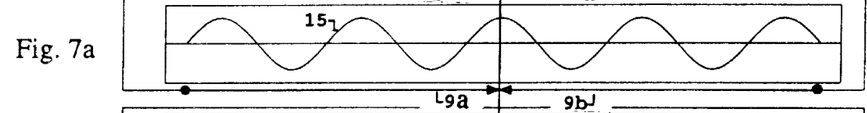
FIGS. 7a and 7b respectively show the envelopes of digital samples for obtaining real and imaginary components of the ninth harmonic phasers.
Figure 7B:
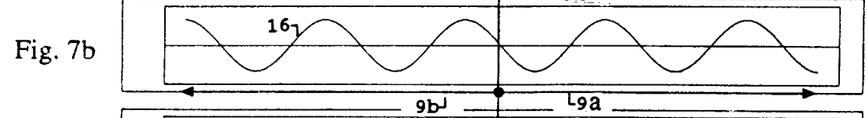
Figure 8A:
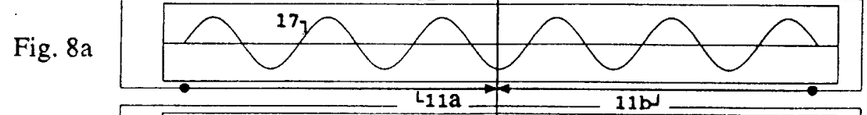
FIGS. 8a and 8b respectively show the envelopes of digital samples for obtaining real and imaginary components of the eleventh harmonic phasers.
Figure 8B:
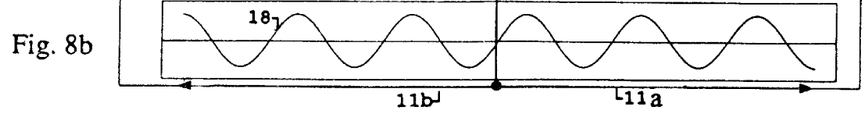

FIGS. 4a and 4b show envelopes of stored values of the sine and cosine wave of the third harmonic of wave 4 in FIG. 3. FIGS. 5a and 5b show envelopes of stored values of the sine and cosine wave of the fifth harmonic of wave 4 in FIG. 3. FIGS. 6a and 6b show envelopes of stored values of the sine and cosine wave of the seventh harmonic of wave 4 in FIG. 3. FIGS. 7a and 7b show envelopes of stored values of the sine and cosine wave of the ninth harmonic of wave 4 in FIG. 3. FIGS. 8a and 8b show envelopes of stored values of the sine and cosine wave of the eleventh harmonic of wave 4 in FIG. 3. Note that the envelopes 6 and 8 for the third harmonic each contain 3 half cycles of the third harmonic, the envelopes 10 and 12 for the fifth harmonic each contain 5 half cycles of the fifth harmonic, the envelopes 13 and 14 for the seventh harmonic each contain 7 half cycles of the seventh harmonic, the envelopes 15 and 16 for the ninth harmonic each contain 9 half cycles of the ninth harmonic, and the envelopes 17 and 18 for the eleventh harmonic each contain 11 half cycles of the eleventh harmonic. The number of half cycles in each envelope is n, the order of the harmonic.

The first non-zero sample of voltage signals can be used as time references for determining phase relationships between harmonic phasors and fundamental components of the voltage signal.

FREQUENCY ERRORS

The effect of odd harmonic distortion on the zero crossing at the beginning of a half sine wave is equal and opposite to the effect at the end of the half cycle. As a result, in practice it is found that the inventive method results in the same number of samples being taken of an AC voltage signal supplied by an electric utility from 90 volts to 140 volts rms.

The actual number of samples may vary, however, due to variations in frequency or due to phase jitter and not always be equal to the stored number of values representing a sine wave. If the number of measured non-zero samples is more than expected, values of the sine table are considered zeros once the sine tables are exceeded in the procedure described above. Thus any extra non-zero samples of an AC signal at the end of an extended half cycle are multiplied by zero. Likewise if less than the expected number of samples are non-zero, the last few product values are set to zero. In other words, any mismatches caused either by extra values from the sine stacks or by extra non-zero samples of the signal produce products equalling zero.

For small amounts of mismatch, such as found with up to a ±2.0 Hz variation in frequency, the resultant error in measuring the fundamental component of an AC signal is found to be approximately one half the percentage change in frequency. The error is inversely proportional to frequency. This is a desirable effect when the process is used in a tapchanger control 76 such as illustrated in FIG. 1 in that the control 76 then tends to keep the ratio of volts per hertz across transformers and motors constant thus preventing saturation of iron cores due to frequency change.

When the process disclosed herein is used in a tapchanger control 76 as illustrated in FIG. 1, it is necessary to measure the fundamental component of the signal in the tapchanger control 76 so as to use the information in determining when to make tapchanges. If the harmonic information is not required within the tapchanger control 76, the digital samples of one half cycle of the AC signals may be sent to an external computer, such as item 903 of FIG. 2 using a communications means such as described in FIG. 2. The harmonic components may then be found using the inventive processes in computer 903 along with a second determination of the fundamental component. These determinations may then be combined, using well known procedures, to obtain results such as total harmonic distortion, the rms amplitude of the AC signal and the harmonic distortion as a percentage of the fundamental component of the signal.

ADVANTAGES OF THE INVENTION

1. Odd harmonic phasers of an AC signals are measured in two cycles each of the AC signal.

2. Only one half cycle of the AC signal is required leaving intervening time for communications and other calculations.

3. One prerecorded stack having only half as many values as the number of samples taken of a half wave of an AC signal is required for each odd order of harmonic.

4. The programs for any order of harmonic are the same except for the stack used.

5. No anti-aliasing filters are required.

6. No fourier transform calculations are required with the summing of products as ADC samples are taken giving an immediately useable result.

7. P and Q components of power flow are directly measured from voltage and current signals using no anti-aliasing filters and requiring no computation other than multiplying the results of measurements by fixed scaling factors for voltage and current.

While the invention has been particularly shown and described with reference to a preferred embodiment thereof, it will be understood by those skilled in the art that various changes in form and in details may be made therein without departing from the spirit and scope of the invention.

I claim:

1. Devices for obtaining the fundamental and odd harmonic components of alternating current (AC) voltages and currents comprising in combination:
    a) analog to digital converter (ADC) means,
    b) microprocessor means for inputting signals proportional to said AC voltages and currents to said ADC means,
    c) first microprocessor program means for obtaining selected numbers, m, samples of said AC signals from said ADC means at equally spaced increments of signal angle $\Theta$,
    d) microprocessor memory means for storing precomputed stacks of m/2 values of n×sin $\Theta$ where n=1, 3, 5, -, -, - (m/2−1) with n=1 corresponding to the fundamental component and n=3 to (m/2−1) corresponding to odd orders of harmonics of said signals, and
    e) second microprocessor program means for summing products of said samples as they are taken and successive values from said stacks starting with values at the bottom and proceeding to values at the top of said selected stacks and continuing summing said products starting with values at the top and proceeding to values at the bottom of said selected stack
    whereby the sums of said products are proportional to real (x) terms of fundamental and harmonic components of said signal corresponding to the stacks elected for each harmonic.

2. Devices as in claim 1 further comprising additional microprocessor program means for summing products of said samples as they are taken and values from said stacks n=3 to (m/2−1) starting with successive values at the top and proceeding to values at the bottom of said selected stacks and continuing summing said products starting with values at the bottom and proceeding to values at the top of said selected stacks
    whereby the sums are proportional to imaginary (jy) terms of harmonic components of said signals corresponding to said selected stacks.

3. A system comprising devices communicating with at least one general purpose computer for obtaining the fundamental and odd harmonic components of alternating current (AC) voltages and currents comprising in combination:
    a) analog to digital converter (ADC) means in said devices,
    b) microprocessor means in said devices for receiving signals proportional to said AC voltages and currents from said ADC means,
    c) first microprocessor program means in said devices for obtaining selected numbers, m, of samples of said AC signals from said ADC means at equally spaced increments of signal angle $\Theta$,
    d) second microprocessor program means for communicating said samples to said computer,
    e) memory means in said computer for storing precomputed stacks of m/2 values of n×sin $\Theta$ where n=1, 3, 5, -, -, - (m/2−1) with n=1 corresponding to the fundamental component and n=3 to (m/2−1) corresponding to odd orders of harmonics of said signal, and f) third program means in said computer for summing products of said samples as they are taken and values from said stacks starting with values at the bottom and proceeding to values at the top of said selected stacks and continuing summing said products starting with values at the top and proceeding to values at the bottom of said selected stack whereby the sum of said products are proportional to real (x) terms of fundamental and harmonic components of said signal corresponding to the selected stacks.

4. A system as in claim 3 further comprising fourth program means in said computer for summing products of said samples as they are taken and successive values from said stacks n=3 to (m/2−1) starting with values at the top and proceeding to values at the bottom of said selected stacks and continuing summing said products starting with values at the bottom and proceeding to values at the top of said selected stacks whereby the sums of said products are proportional to imaginary (jy) terms of harmonic components of said signals corresponding to the selected stack.

5. Alternating current (AC) control devices for responding to fundamental components of alternating current (AC) voltages and currents comprising in combination:

a) capacitive burden means having first and second terminals, b) circuit ground means, c) AC current transformer means furnishing currents to said first terminal of said capacitive burden means and from second terminal mean of said capacitive burden to said circuit ground mean, d) resistive burden means having first and second terminals, e) connective means connecting said AC currents coming from said circuit grounds to first terminals of said resistive burden means and from second terminals of said resistive burdens returning to said transformer, f) analog to digital converter (ADC) means, g) first resistor divider means for providing first AC current signals to said ADC means representing voltage drops across said capacitive burdens, and h) second resistor divider means for providing second AC current signals to said ADC means representing voltage drops across said resistive burdens, whereby the first signal provides improved response to the fundamental of the AC current.

6. Devices as in claim 5 further comprising microprocessor means for taking digital samples of positive half cycles of said first AC current signals and determining fundamental components of said first AC current signals.

7. Devices as in claim 5 further comprising microprocessor means for taking digital samples of positive half cycles of said second AC current signals and determining odd harmonic components of said second AC current signals.

8. Devices as in claim 7 further comprising in combination:

a) microprocessor means for taking digital samples of positive half cycles of AC voltage signals, b) first microprocessor program means for determining timing intervals between first samples of said AC voltage signals and first samples of said second AC current signals, and c) second microprocessor program means for obtaining real and imaginary harmonic phaser components using said first samples of AC voltage signals as harmonic phaser references.

9. Devices as in claim 7 further comprising communications means for sending said digital samples of AC voltage and current signals together with said times between first samples of said voltage signals and first samples of said current signals to external computer means for computation of odd harmonics.

10. A method for determining phase relations between phasers for the fundamental and phasers for odd harmonic components of AC signals having half cycles of selected polarity consisting of the steps of:

a) taking first non-zero samples of said AC signals of first said half cycles, b) computing harmonic phasers utilizing said samples, and c) using said first non-zero samples as the time reference for said harmonic phasers computed in subsequent half cycles.

11. A method for determining phasers for the fundamental and odd harmonic components of an AC signal having half cycles of selected polarity consisting of the steps of:

a) taking digital samples of said half cycles of a selected polarity, b) storing precomputed stacks containing values of the sine function between zero and (n×90°) of sine values with each value corresponding to a digital sample taken during said half cycle of selected polarity, c) multiplying values successively from said stacks first from the bottom to the top and then from the top to the bottom thereby providing sine values by its said corresponding sample to obtain individual products, and d) summing said products thereby obtaining sums wherein, n equal to one provides said fundamental component and n equal to an odd number greater than one provides a corresponding real term of a phaser for the nth odd harmonic component.

12. A method as in claim 11 further including the step of obtaining said sums of products proportional to the magnitude of the real term of a phaser for the nth component of said signal wherein, n equal to one provides said fundamental component and n equal to an odd number greater than one provides a corresponding odd harmonic components, said stacks containing values of the sine function between zero and (n×90)°, utilizing values successively from said stacks first from the bottom to the top and then from the top to the bottom thereby providing sine values each corresponding to an individual sample taken during the full said half cycle of selected polarity.

13. A method as in claim 11 further including the step of obtaining the magnitude of the imaginary term of said phasor by utilizing successive values from said stacks starting first from the top to the bottom and proceeding from the bottom to the top thereby providing cosine values each corresponding to an individual sample taken during the full said half cycle of selected polarity.

14. A method as in claim 11 further including the step of:

a) setting said individual products to zero whenever a digital sample is taken which equals zero, and b) setting said individual products to zero whenever a digital sample is taken which is non-zero and there are no values left in said stacks whereby the ratios of volts per hertz across transformers and motors are kept constant.

15. A method as in claim 11 further including the step of comparing an rms measurement of said AC signal with said real component of said AC signal to obtain the total harmonic distortion of said AC signal.

16. A method as in claim 11 further including the step of obtaining the magnitude of the imaginary term of said phaser by multiplying successive value from said stacks starting first from the top to the bottom and proceeding from the bottom to the top thereby providing cosine values each corresponding to an individual sample taken during the full said half cycle of selected polarity.

17. A method as in claim 11 further including the step of:
a) setting said individual products to zero whenever a digital sample is taken which equals zero, and
b) setting said individual products to zero whenever a digital sample is taken which is non-zero and there are no values left in said stacks whereby the amplitude versus frequency error in determining the phaser fundamental maintains the ratios of volts per hertz of said AC signal constant.

18. A method as in claim 11 further including the step of comparing an rms measurement of said AC signal with said real component of said AC signal to obtain the total harmonic distortion of said AC signal.

* * * * *